(12) United States Patent
Kim et al.

(10) Patent No.: US 12,371,787 B2
(45) Date of Patent: Jul. 29, 2025

(54) METHOD OF FORMING DIELECTRIC FILMS, NEW PRECURSORS AND THEIR USE IN THE SEMI-CONDUCTOR MANUFACTURING

(71) Applicant: L'Air Liquide Société Anonyme pour l'Etude et l'Exploitation des Procédés Georges Claude, Paris (FR)

(72) Inventors: Daehyeon Kim, Hwaseong-si (KR); Jooho Lee, Seoul (KR); Wontae Noh, Seoul (KR)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 126 days.

(21) Appl. No.: 18/018,277

(22) PCT Filed: Jul. 28, 2020

(86) PCT No.: PCT/EP2020/071293
§ 371 (c)(1),
(2) Date: Jan. 27, 2023

(87) PCT Pub. No.: WO2022/022813
PCT Pub. Date: Feb. 3, 2022

(65) Prior Publication Data
US 2023/0313375 A1    Oct. 5, 2023

(51) Int. Cl.
*C23C 16/455*    (2006.01)
(52) U.S. Cl.
CPC .......................... *C23C 16/45553* (2013.01)

(58) Field of Classification Search
CPC .......................................................... C07F 9/00
See application file for complete search history.

(56) References Cited

U.S. PATENT DOCUMENTS

| 7,993,782 B2 | 8/2011 | Takada et al. |
| 2007/0042213 A1 | 2/2007 | Reuter et al. |
| 2008/0038466 A1 | 2/2008 | Reuter et al. |

(Continued)

FOREIGN PATENT DOCUMENTS

| DE | 10 2006 037955 | 2/2008 |
| EP | 1 916 253 | 4/2008 |

(Continued)

OTHER PUBLICATIONS

Alen, P. et al., The growth and diffusion barrier properties of atomic layer deposited $NbN_x$ thin films, Thin Solid Films 491 (2005) 235-241.

(Continued)

*Primary Examiner* — Robert A Vetere
(74) *Attorney, Agent, or Firm* — Allen E. White (57) ABSTRACT

A Metal-containing film forming composition comprising a precursor having the formula: $M(=NR^1)(OR^2)(OR^3)_mL$. Wherein, M=V or Nb or Ta; $R^1$-$R^3$=independently H or C1-C10 alkyl group; L=Substituted or unsubstituted cyclopentadienes, cyclohexadienes, cycloheptadienes, cyclooctadienes, fluorenes, indenes, fused ring systems, propene, butadiene, pentadienes, hexadienes, heptadienes: m=0 or 1.

10 Claims, 4 Drawing Sheets

(56) References Cited

U.S. PATENT DOCUMENTS

| | | | |
|---|---|---|---|
| 2010/0010248 A1 | 1/2010 | Tada et al. | |
| 2011/0195574 A1 | 8/2011 | Blasco et al. | |
| 2014/0119977 A1* | 5/2014 | Gatineau | C23C 16/18 |
| | | | 420/556 |
| 2016/0251756 A1 | 9/2016 | Lansalot-Matras et al. | |
| 2020/0075956 A1 | 3/2020 | Sugiura et al. | |
| 2020/0407380 A1* | 12/2020 | Ha | H01L 21/02 |
| 2021/0403492 A1 | 12/2021 | Lee et al. | |

FOREIGN PATENT DOCUMENTS

| | | | |
|---|---|---|---|
| KR | 2013 0049020 | 5/2013 | |
| WO | WO 2012 026561 | 3/2012 | |
| WO | WO 2015 072589 | 5/2015 | |
| WO | WO 2019 156400 | 8/2019 | |
| WO | WO-2019156400 A1 * | 8/2019 | C07F 9/00 |

OTHER PUBLICATIONS

Elers, K.-E. et al., NbCl$_5$ as a precursor in atomic layer epitaxy, Applied Surface Sciences 82/83 (1994) 468-474.

Elorriaga, D. et al., Asymmetric niobium guanidinates as intermediates in the catalytic guanylation of amines, Dalton Transactions, 2013, 42, 8223-8230.

Gibson, V.C. et al., Pairwise ligand exchange reactions in tetrahedral and pseudo-tetrahedral transition metal complexes, Dalton Transactions, 2004, 4497-4465.

Gilmore, C.M. et al., Stabilized zirconia-alumina thin films, Alumina, J. Vac. Sci. Technol A 4 (6), 1986. 2598-2600.

Gudat, D. et al., Multinuclear magnetic resonance study of some imidovanadium complexes, Magn. Reson. Chem. 2002; 40: 139-146.

Gust, K.R. et al., Synthesis, structure, and properties of niobium and tantalum imido complexes bearing pyrazolato ligands. Crystal structures of Ta(Nt—Bu)(t-Bu$_2$Pz)$_3$, Ta(Ni—Pr)(t-Bu$_2$Pz)$_3$, Ta(Nt—Bu)(Me$_2$Pz)$_3$(py), and Ta(Nt—Bu)(t-Bu$_2$Pz)$_2$(Cl)(py), Polyhedron 20 (2001) 805-813.

Kittl, J.A. et al., High-k dielectrics for future generation memory devices, Microelectronic Engineering 86 (2009) 1789-1795.

Mayer, J.M. et al., Hydrogen-transfer reactions which generate new imine, imido, and trimethylenemethane complexes of tantalum, J. Am. Chem. Soc. May 1983, 2651-2660.

Ohta, N. et al., LiNbO$_3$-coated LiCoO$_2$ as cathode material for all solid-state lithium secondary batteries, Electrochem. Commun. 2007, 9 1486-1490.

Rampelberg, G. et al., Low temperature plasma-enhanced atomic layer deposition of thin vanadium nitride layers for copper diffusion barriers, Applied Physics Letters 102, 111910 (2013).

Ritala, M. et al., Effects of intermediate zinc pulses on properties of TiN and NbN films deposited by atomic layer epitaxy, Applied Surface Science 120 (1997) 199-212.

Tomson, N.C. et al., Synthesis and reactivity of cationic niobium and tantalum methyl complexes supported by imido and β-diketiminato ligands, Dalton Transactions, 2011, 40, 7718-7729.

Wang, B. et al., Atomic layer deposition of lithium niobium oxides as potential solid-state electrolytes for lithium-ion batteries, Applied materials a& Interfaces 2018, 10, 1654-1661.

International Search Report and Written Opinion for corresponding PCT/EP2020/071293, May 5, 2021.

Moss, G.P., Nomenclature of fused and bridged fused ring systems, Pure & Appl. Chem., vol. 70, No. 1, 143-216, 1998.

* cited by examiner

METHOD OF FORMING DIELECTRIC FILMS, NEW PRECURSORS AND THEIR USE IN THE SEMI-CONDUCTOR MANUFACTURING

CROSS REFERENCE TO RELATED APPLICATIONS

This application is a 371 of International Application No. PCT/EP2020/071293, filed Jul. 28, 2020, the entire contents of which are incorporated herein by reference.

BACKGROUND

The invention relates to metal-containing film forming composition comprising a precursor of Niobium or Vanadium and a method of forming a Nb or Vanadium-containing film on one or more substrates via vapor deposition processes using the Niobium, Vanadium containing film forming compositions.

Metal Oxide films, such as Niobium Oxide ($Nb_2O_5$), have been extensively utilized in various fields of technology. Traditionally these oxides have been applied as resistive films used as high-k materials for insulating layers. For instance, a thin layer of $Nb_2O_5$ between two $ZrO_2$ dielectric layers is expected to help significantly reduce leakage current and stabilize the cubic/tetragonal phase of the $ZrO_2$, affording higher k values in the current MIM capacitor of a DRAM (Alumina, J. Vac. Sci. Technol A 4 (6), 1986 and Microelectronic Engineering 86 (2009) 1789-1795). A thin layer of $V_2O_5$ may behave similarly.

Metal Nitride films, such as Niobium Nitride, Vanadium Nitride ($NbN_x$, $VN_x$ wherein x is approximately 1) have been extensively utilized in various fields of technology. Traditionally these nitrides have been applied as hard and decorative coatings but during the past decade they have increasingly been used as diffusion barrier and adhesion/glue layers in microelectronic devices [Applied Surface Science 120 (1997) 199-212].

Mixed oxides containing Nb is also of high interest in energy storage applications for instance as thin, highly ionic conductive, interface layers between active cathode material and electrolyte in all-solid-state batteries and Li-ion batteries [U.S. Pat. No. 7,993,782B2]. For instance, a thin layer of Lithium Niobate deposited on active cathode materials in the right crystalline phase has been reported to reduce reaction resistance and increase battery power output [US 2020/0075956 A1]. Lithium Niobate is of particular interest as an interface layer because it displays a significantly higher ionic conductivity [Electrochem. Commun. 2007, 9, 1486-1490]. Vapor phase deposition such as Atomic Layer Deposition has been reported to be a viable technique to deposit such stabilizing interface layers onto low Cobalt Cathodes Materials [ACS Appl. Mater. Interfaces 2018, 10, 1654-1661].

$NbCl_5$ for instance has been examined as a niobium source for Atomic Layer Epitaxial growth of $NbN_x$, but the process required Zn as a reducing agent [Applied Surface Science 82/83 (1994) 468-474]. $NbN_x$ films were also deposited by atomic layer deposition using $NbCl_5$ and $NH_3$ [Thin Solid Films 491 (2005) 235-241]. The chlorine content showed strong temperature dependence, as the film deposited at 500° C. was almost chlorine free, while the chlorine content was 8% when the deposition temperature was as low as 250° C. The high melting point of $NbCl_5$ also makes this precursor difficult to use in the vapor deposition process.

As an example for $VN_x$, $V(NMe_2)_4$ has been examined as a vanadium source for chemical vapor deposition of $VN_x$ [Chemical Vapor Deposition of Vanadium, Niobium, and Tantalum Nitride Thin Films by Fix et al., Chem. Mater. 1993, 5, 614-619]. $VN_x$ films were also deposited by plasma enhanced atomic layer deposition using $V(NEtMe)_4$ and $NH_3$. [Low Temperature Plasma-Enhanced Atomic Layer Deposition of Thin Vanadium Nitride Layers for Copper Diffusion Barriers by Rampelberg et al., Appl. Phys. Lett., 102, 111910 (2013)].

Gust et al. disclose the synthesis, structure, and properties of niobium and tantalum imido complexes bearing pyrazolato ligands and their potential use for the growth of tantalum nitride films by CVD (Polyhedron 20 (2001) 805-813).

Elorriaga et al. disclose asymmetric niobium guanidinates as intermediates in the catalytic guanylation of amines (Dalton Transactions, 2013, Vol. 42, Issue 23 pp. 8223-8230).

Tomson et al. disclose the synthesis and reactivity of the cationic Nb and Ta monomethyl complexes [(BDI)MeM(NtBu)][X][BDI=2,6-$iPr_2C_6H_3$—N—C(Me)CH—C(Me)-N (2, 6-$iPr_2C_6H_3$); X=MeB($C_6F_5$)$_3$ or B($C_6F_5$)$_4$) (Dalton Transactions 2011 Vol. 40, Issue 30, pp. 7718-7729).

DE102006037955 discloses tantalum- and niobium-compounds having the formula $R^4R^5R^6M(R^1NNR^2R^3)_2$, wherein M is Ta or Nb; $R^1$-$R^3$=$C_{1-12}$ alkyl, $C_{5-12}$ cycloalkyl, $C_{6-10}$ aryl, alkenyl, $C_{1-4}$ triorganosilyl; and $R^4$-$R^6$=halo, (cyclo)alkoxy, aryloxy, siloxy, BH4, allyl, indenyl, benzyl, cyclopentadienyl, $CH_2SiMe_3$, silylamido, amido, or imino.

Maestre et al. discloses the reaction of the cyclopentadienyl-silyl-amido titanium compound with group 5 metal monocyclopentadienyl complexes to form $NbCp(NH(CH_2)_2$—$NH_2)Cl_3$ and $NbCpCl_2(N$—$(CH_2)_2$—N).

Gibson et al. discloses the ligand exchange reaction and kinetic study with Mo, Nb complexes including the Nb(=NtBu)Cp(OiPr)$_2$, Nb(=NtBu)Cp(OtBu)$_2$ (Dalton Transactions (2003), (23), 4457-4465).

Today, there is a need for providing liquid or low melting point (<50° C. at standard pressure), highly thermally stable, Niobium and Vanadium containing precursor molecules suitable for vapor phase film deposition with controlled thickness and composition at high temperature.

SUMMARY

According to the invention, certain precursors have been found suitable for the deposition of Nb and V containing thin films by ALD processes and to have the following advantages:
  They are liquid at room temperature or having a melting point lower than 50° C.,
  They are thermally stable to enable proper distribution (gas phase or direct liquid injection) without particles generation,
  They are thermally stable to allow wide self-limited ALD window, allowing deposition of a variety of Nb and V containing films, by using one or a combination of co-reactants. The co-reactant can typically be selected from an oxidizing agent, such as O2, O3, H2O, H2O2, alcohols, or a nitriding agent such as ammonia, amines, polyamines, hydrazines, NO. Such co-reactant may be plasma activated or not
  They can also be used in combination with another precursor to deposit mixed films. More particularly, these precursors are suitable to be used with precursors of group IV and other group V elements, as well as with phosphorous or lithium compounds for energy storage applications for instance.

According to a first embodiment, the invention relates to a Metal-containing film forming composition comprising a precursor having the formula:

Wherein, M=V or Nb or Ta; $R^1$-$R^3$=independently H or C1-C10 alkyl group;
L=Substituted or unsubstituted cyclopentadienes, cyclohexadienes, cycloheptadienes, cyclooctadienes, fluorenes, indenes, fused ring systems, propene, butadiene, pentadienes, hexadienes, heptadienes; m=0 or 1.

According to other particular embodiments, the invention concerns:

A Metal-containing film forming composition as defined above, wherein $R^1$ is H, $R^2$ is tBu; $R^3$ and $R^4$ are Et.
A Metal-containing film forming composition as defined above, wherein $R^1$ is H, $R^2$, $R^3$ and $R^4$ are tBu.
A Metal-containing film forming composition as defined above, wherein $R^1$ is H, $R^2$ is tBu; $R^3$ and $R^4$ are sBu.
A Metal-containing film forming composition as defined above, wherein M is Vanadium.
A Metal-containing film forming composition as defined above, wherein M is Niobium.
A Metal-containing film forming composition of formula:

wherein each $R^4$ is H or a C1-C10 alkyl group or a fluoro group; n≤5.

The Metal-containing film forming composition of formula:

wherein each $R^4$ to $R^{10}$ is independently H or a C1-C10 alkyl group or a fluoro group.

The Metal-containing film forming composition of formula:

wherein each $R^4$ to $R^6$ is independently H or a C1-C10 alkyl group, or a fluoro group.

The Metal-containing film forming composition of formula:

wherein each $R^4$ to $R^6$ is independently H or a C1-C10 alkyl group, or a fluoro group.

A method of forming a Metal-containing film, the method comprising introducing into a reactor having a substrate therein a vapor of the Metal-containing film forming composition as defined above; and depositing at least part of the precursor onto the substrate.
A method as defined above, further comprising introducing a reactant into the reactor.
A method as defined above, wherein the reactant is selected from the group consisting of $O_2$, $O_3$, $H_2O$, $H_2O_2$, NO, $N_2O$, $NO_2$, TMPO, oxygen radicals thereof, and mixtures thereof.
A method as defined above, wherein M=Nb and the Niobium-containing film forming composition and the reactant are introduced into the chamber sequentially and the reactor is configured for atomic layer deposition.
A method as defined above wherein the substrate is a cathode active material powder.
A method as defined above wherein the substrate is a cathode material consisting of a cathode active material powder, a conductive carbon and a binder material deposited onto a current collector foil.
A method as defined above, wherein the substrate is $ZrO_2$ and the Niobium-containing film forming composition is used to form a DRAM capacitor.
The method, further comprising plasma treating the reactant.
According to another embodiment, the invention relates to a method of manufacturing a thin interface layer into a Lithium-ion or into an all-solid-state-batteries device. The thin layer is a Niobium containing oxide layer deposited by Atomic Layer Deposition using the Nb precursor of the invention having the formula:

$R^1$-$R^3$=independently H or C1-C10 alkyl group;
L=Substituted or unsubstituted cyclopentadienes, cyclohexadienes, cycloheptadienes, cyclooctadienes, fluorenes, indenes, fused ring systems, propene, butadiene, pentadienes, hexadienes, heptadienes; m=0 or 1; and a co-reactant onto a cathode active material in the form of a powder, or onto a cathode. The co-reactant can be selected from the list consisting of $O_2$, $O_3$, $H_2O$, $H_2O_2$, NO, $NO_2$, $H_2O$ or a NOx, trimethylphosphate, diethyl phosphoramidate, a sulfate or any other oxygen containing species. The thin layer can be a niobium containing ternary or quaternary oxide, such as LiNbO, LiNb(M)O, NbMO with M being selected from the list consisting of Zr, Ti, Co, W, Ta, V, Sr, Ba, La, Y, Sc, Mn, Ni, Mo. The thin interface layer can be deposited directly onto the cathode active material for instance in a fluidized bed ALD-reactor. The cathode active material is the main element in the composition of cathode battery cells. The cathode materials are for example Cobalt, Nickel and Manganese in the crystal structure such as the layered structure forms a multi-metal oxide material in which lithium is inserted. The cathode active material may preferably be a "NMC" (a lithium nickel manganese cobalt oxide), a NCA (a lithium nickel cobalt aluminum oxide), a LNO (a lithium nickel oxide) a LMNO (a lithium manganese nickel oxide), or a LFP (a lithium iron phosphate). For instance, the cathode active material can be NMC622 or NMC811. The thin interface layer may be done on the electrode active material powder, on electrode active material porous materials, on different shapes of electrode active materials, or in pre-formed electrodes in which the electrode active material may be already associated with conductive carbons and/or binders and may already be supported by a current collector foil.

BRIEF DESCRIPTION OF THE DRAWINGS

For a further understanding of the nature and objects for the present invention, reference should be made to the following detailed description, taken in conjunction with the accompanying drawings, in which like elements are given the same or analogous reference numbers and wherein.

DETAILED DESCRIPTION OF PREFERRED EMBODIMENTS

The following examples are an illustration of the various embodiments of the present invention, without being a limitation.

EXAMPLES

Example 1

Synthesis of Niobium tButyl Imido Cyclopentadienyl Ethoxy, Nb(=NtBu)Cp(OEt)$_2$

To a solution of Nb(=NtBu)Cp(NMe$_2$)$_2$ (2 g, 6.3 mmol) in 30 mL of Toluene at −78° C., was added dropwise a solution of Ethyl alcohol (0.58 g, 12.6 mmol). After stirring the mixture at room temperature for 12 h, the solvent was removed under vacuum to give yellow oil. The material was then purified by distillation up to 100° C. at 25 mTorr to give 1.34 g (66.6%) of yellow oil. The material was characterized by NMR $^1$H (δ, ppm, C$_6$D$_6$): 6.18 (s, 5H), 4.54 (q, 4H), 1.28 (t, 6H), 1.16 (s, 9H).

Figure 1:
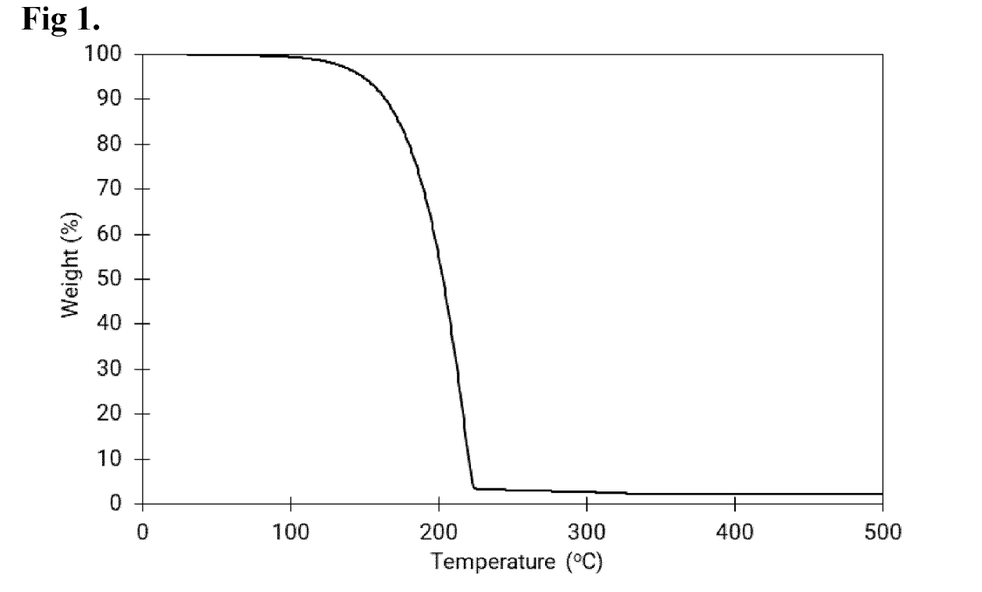
FIG. 1. is a ThermoGravimetric Analysis (TGA) graph demonstrating the percentage of weight with increasing temperature of Niobium tButyl Imido Cyclopentadienyl Ethoxy, Nb(=NtBu)Cp(OEt)$_2$.
Figure 4:
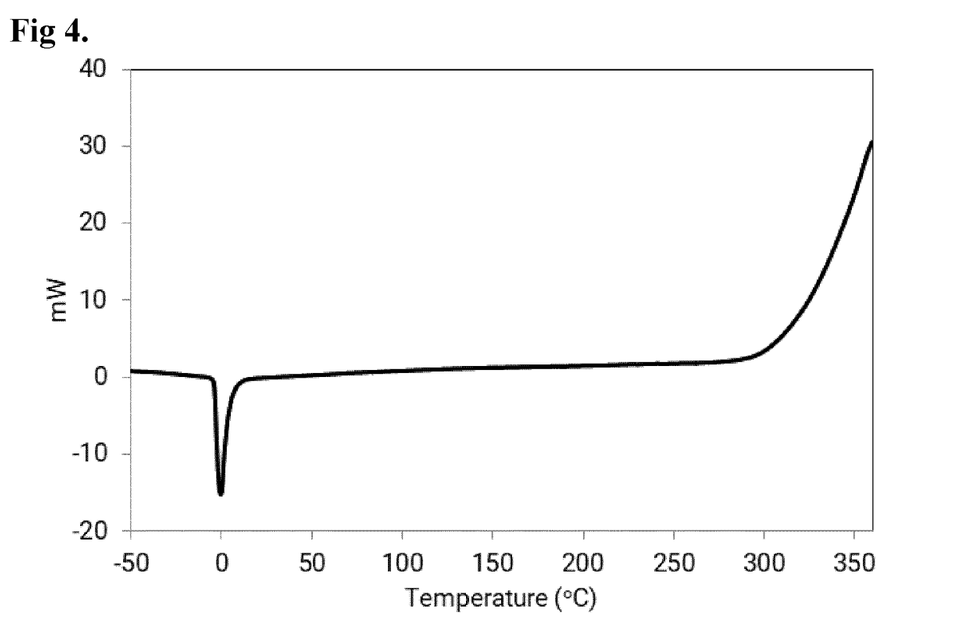
FIG. 4. is a differential scanning calorimetry(DSC) of Niobium tButyl Imido Cyclopentadienyl Ethoxy, Nb(=NtBu)Cp(OEt)$_2$.

The purified product left a 2.1% residual mass during open-cup TGA analysis measured at a temperature rising rate of 10° C./min in an atmosphere which flows nitrogen at 200 mL/min. These results are shown in FIG. 1, which is a TGA graph illustrating the percentage of weight upon temperature increase. Onset temperature of melting (−3.8° C.) and decomposition(317.3° C.) of the product were measured by Differential scanning calorimetry(DSC), which are shown in FIG. 4.

Example 2

Synthesis of Niobium tButyl Imido Cyclopentadienyl tButoxy, Nb(=NtBu)Cp(OtBu)$_2$ To a solution of Nb(=NtBu)Cp(NMe$_2$)$_2$ (2 g, 6.3 mmol) in 30 mL of Toluene at −78° C., was added dropwise a solution of tert-Butyl alcohol (0.93 g, 12.6 mmol). After stirring the mixture at room temperature for 12 h, the solvent was removed under vacuum to give yellow oil. The material was then purified by distillation up to 100° C. at 25 mTorr to give 2.0 g (84.6%) of yellow oil. The material was characterized by NMR $^1$H (δ, ppm, C$_6$D$_6$): 6.17 (s, 5H), 1.32 (s, 18H), 1.21 (s, 9H).

Figure 2:
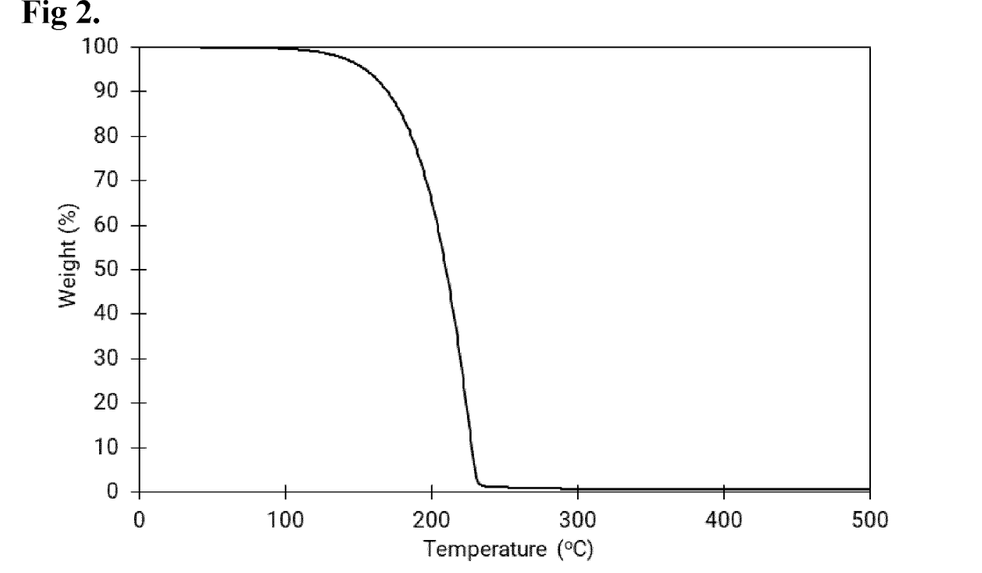
FIG. 2. is a thermoGravimetric Analysis (TGA) graph demonstrating the percentage of weight with increasing temperature of Niobium tButyl Imido Cyclopentadienyl tButoxy, Nb(=NtBu)Cp(OtBu)$_2$.
Figure 5:
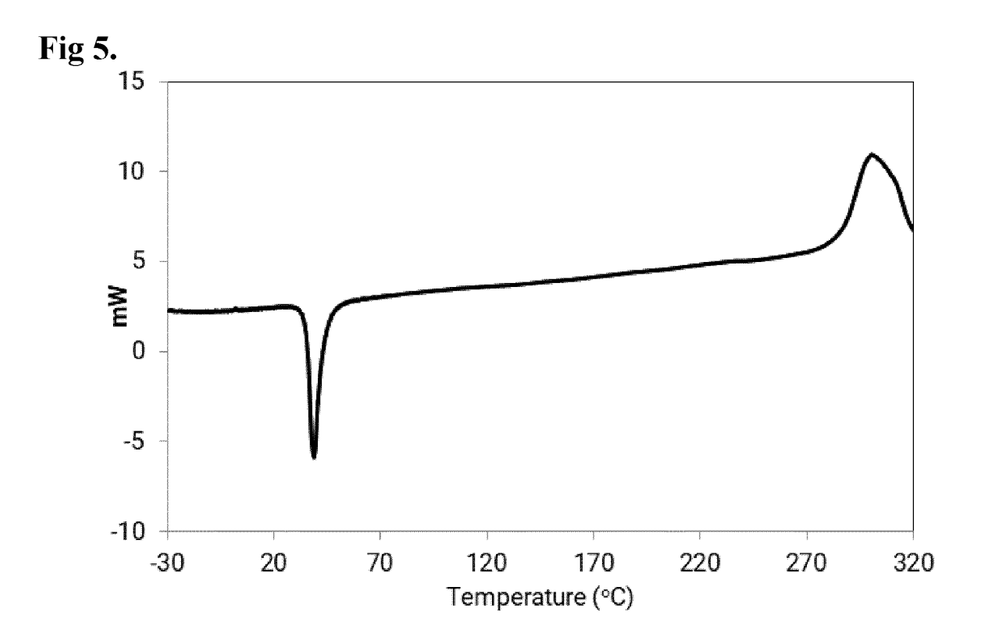
FIG. 5. is a differential scanning calorimetry(DSC) of Niobium tButyl Imido Cyclopentadienyl tButoxy, Nb(=NtBu)Cp(OtBu)$_2$.

The purified product left a 0.6% residual mass during open-cup TGA analysis measured at a temperature rising rate of 10° C./min in an atmosphere which flows nitrogen at 200 mL/min. These results are shown in FIG. 2, which is a TGA graph illustrating the percentage of weight upon temperature increase. Onset temperature of melting(34.5° C.) and decomposition(285.1° C.) of the product were measured by Differential scanning calorimetry(DSC), which are shown in FIG. 5.

Example 3

Synthesis of Niobium tButyl Imido Cyclopentadienyl sButoxy Nb(=NtBu)Cp(OsBu)$_2$ To a solution of Nb(=NtBu)Cp(NMe$_2$)$_2$ (2 g, 6.3 mmol) in 30 mL of Toluene at −78° C., was added dropwise a solution of sec-Butyl alcohol (0.93 g, 12.6 mmol). After stirring the mixture at room temperature for 12 h, the solvent was removed under vacuum to give yellow oil. The material was then purified by distillation up to 125° C. at 25 mTorr to give 1.75 g (74%) of yellow oil. The material was characterized by NMR $^1$H (δ, ppm, C$_6$D$_6$): 6.19 (s, 5H), 4.49 (m, 2H), 1.61 (m, 2H), 1.49 (m, 2H), 1.31 (d, 3H), 1.26 (d, 3H), 1.18 (s, 9H), 0.99 (t, 6H).

Figure 3:
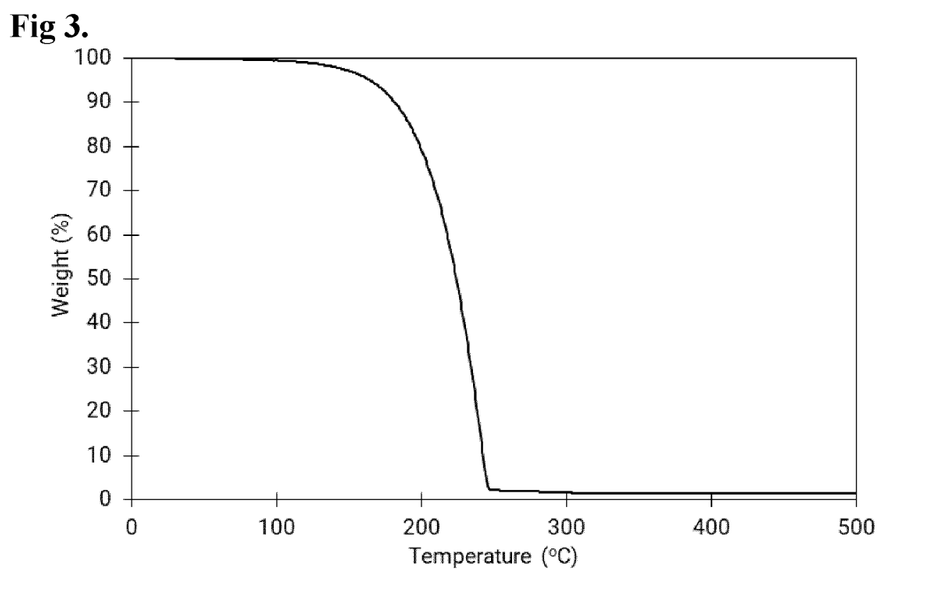
FIG. 3. is a thermoGravimetric Analysis (TGA) graph demonstrating the percentage of weight with increasing temperature of Niobium tButyl Imido Cyclopentadienyl sButoxy Nb(=NtBu)Cp(OsBu)$_2$.
Figure 6:
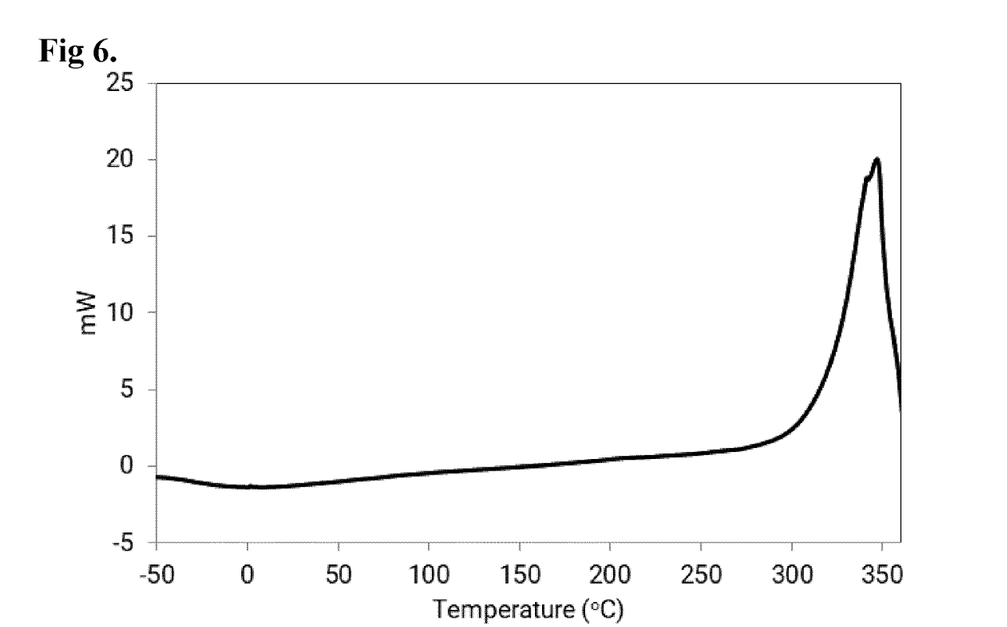
FIG. 6. is a differential scanning calorimetry(DSC) of Niobium tButyl Imido Cyclopentadienyl sButoxy Nb(=NtBu)Cp(OsBu)$_2$.

The purified product left a 1.3% residual mass during open-cup TGA analysis measured at a temperature rising rate of 10° C./min in an atmosphere which flows nitrogen at 200 mL/min. These results are shown in FIG. 3, which is a TGA graph illustrating the percentage of weight upon temperature increase. Onset temperature of decomposition (318.6° C.) of the product were measured by Differential scanning calorimetry(DSC), which are shown in FIG. 6.

Other Examples

1. Nb(=NtBu)(RCp)(OEt)$_2$ can be synthesized from the way below.

(R=H or C1-C10 alkyl group)

To a solution of Nb(=NtBu)(RCp)(NMe$_2$)$_2$ in Toluene at −78° C., was added dropwise a solution of ethyl alcohol. After stirring the mixture at room temperature for 12 h, the solvent was removed under vacuum. The material was then purified by distillation or sublimation to give a final product.

2. Nb(=NR)(Cp)(OEt)$_2$ can be synthesized from the way below.

(R=H or C1-C10 alkyl group)

To a solution of Nb(=NR)Cp(NMe$_2$)$_2$ in Toluene at −78° C., was added dropwise a solution of ethyl alcohol (12.6 mmol). After stirring the mixture at room temperature for 12 h, the solvent was removed under vacuum. The material was then purified by distillation or sublimation to give a final product.

3. V(=NtBu)(Cp)(OEt)$_2$ can be synthesized from the way below.

To a solution of V(=NtBu)Cp(NMe$_2$)$_2$ in Toluene at −78° C., was added dropwise a solution of ethyl alcohol (12.6 mmol). After stirring the mixture at room temperature for 12 h, the solvent was removed under vacuum. The material was then purified by distillation or sublimation to give a final product.

Figure 7:
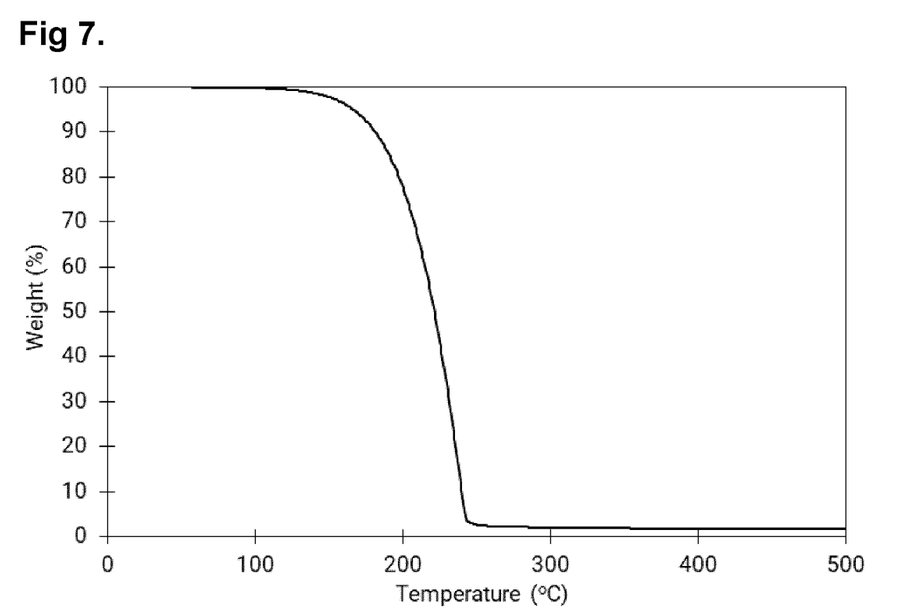
FIG. 7 is a ThermoGravimetric Analysis (TGA) graph demonstrating the percentage of weight with increasing temperature of Niobium tButyl Imido Cyclopentadienyl Dimethylamido, Nb(=NtBu)Cp(NMe$_2$)$_2$

In addition FIG. 7 represents a ThermoGravimetric Analysis (TGA) graph demonstrating the percentage of weight with increasing temperature of Niobium tButyl Imido Cyclopentadienyl Dimethylamido, Nb(=NtBu)Cp(NMe$_2$)$_2$, which is the precursor chosen as the reference in the state of the art.

The following table illustrates a comparison of the properties of the following precursors:

| Compounds | Temperature at 133 Pa |
|---|---|
| Nb(=NtBu)Cp(OEt)$_2$ | 100° C. |
| Nb(=NtBu)Cp(OtBu)$_2$ | 105° C. |
| Nb(=NtBu)Cp(OsBu)$_2$ | 119° C. |
| Nb(=NtBu)Cp(NMe$_2$)(OtBu) | 106° C. |
| Nb(=NtBu)Cp(NMe$_2$)$_2$ | 117° C. |
| Nb(Cp)$_2$(iPr-amd)$_2$ | 170° C. |

CONCLUSION

The disclosed precursor compounds offer high thermal stability, high volatility and low viscosity when compared to Nb(=NtBu)Cp(NMe$_2$)$_2$. These properties enable more effective and efficient vapor deposition process.

While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims. The present invention may suitably comprise, consist or consist essentially of the elements disclosed and may be practiced in the absence of an element not disclosed.

Furthermore, if there is language referring to order, such as first and second, it should be understood in an exemplary sense and not in a limiting sense. For example, it can be recognized by those skilled in the art that certain steps can be combined into a single step.

The singular forms "a", "an" and "the" include plural referents, unless the context clearly dictates otherwise.

"Comprising" in a claim is an open transitional term which means the subsequently identified claim elements are a nonexclusive listing (i.e., anything else may be additionally included and remain within the scope of "comprising"). "Comprising" as used herein may be replaced by the more limited transitional terms "consisting essentially of" and "consisting of" unless otherwise indicated herein.

"Providing" in a claim is defined to mean furnishing, supplying, making available, or preparing something. The step may be performed by any actor in the absence of express language in the claim to the contrary.

Optional or optionally means that the subsequently described event or circumstances may or may not occur. The description includes instances where the event or circumstance occurs and instances where it does not occur.

Ranges may be expressed herein as from about one particular value, and/or to about another particular value. When such a range is expressed, it is to be understood that another embodiment is from the one particular value and/or to the other particular value, along with all combinations within said range.

All references identified herein are each hereby incorporated by reference into this application in their entireties, as well as for the specific information for which each is cited.

The invention claimed is:

1. A Metal-containing film forming composition comprising a precursor having the formula:

wherein, M=V or Nb or Ta; R1-R3=independently H or C1-C10 alkyl group;

L=Substituted or unsubstituted cyclopentadienes, cyclohexadienes, cycloheptadienes, cyclooctadienes, fluorenes, indenes, fused ring systems, propene, butadiene, pentadienes, hexadienes, heptadienes; m=0 or 1.

2. The Metal-containing film forming composition of claim 1 wherein, M is Vanadium.

3. The Metal-containing film forming composition of claim 1 wherein, M is Niobium.

4. The Metal-containing film forming composition according to claim 1, of formula:

wherein each R4 is H or a C1-C10 alkyl group or a fluoro group; n≤5.

5. The Metal-containing film forming composition of claim 4, wherein R1 is H, R2 is tBu; R3 and R4 are Et.

6. The Metal-containing film forming composition of claim 4, wherein R1 is H, R2, R3 and R4 are tBu.

7. The Metal-containing film forming composition of claim 4, wherein R1 is H, R2 is tBu; R3 and R4 are sBu.

8. The Metal-containing film forming composition according to claim 1, of formula:

wherein each R4 to R10 is independently H or a C1-C10 alkyl group or a fluoro group.

9. The Metal-containing film forming composition according to claim 1, of formula:

wherein R4 and R5 are independently H or a C1-C10 alkyl group, or a fluoro group.

10. The Metal-containing film forming composition according to claim 1, of formula:

wherein each R4 to R6 is independently H or a C1-C10 alkyl group, or a fluoro group.

* * * * *